United States Patent [19]
Harmsen et al.

[11] Patent Number: 6,165,405
[45] Date of Patent: Dec. 26, 2000

[54] PRESS FOR ENCAPSULATING ELECTRONIC COMPONENTS AND METHODS FOR USE OF THE PRESS

[75] Inventors: Wilhelmus Hendrikus Johannes Harmsen, Wehl; Lambertus Franciscus Wilhelmus Van Haren, Druten; Johannes Lambertus Gerardus Maria Venrooij, Duiven, all of Netherlands

[73] Assignee: Fico B.V., Didam, Netherlands

[21] Appl. No.: 09/155,177

[22] PCT Filed: Mar. 29, 1997

[86] PCT No.: PCT/NL97/00142

§ 371 Date: Oct. 19, 1998

§ 102(e) Date: Oct. 19, 1998

[87] PCT Pub. No.: WO97/35701

PCT Pub. Date: Oct. 2, 1997

[30] Foreign Application Priority Data

Mar. 22, 1996 [NL] Netherlands ............... 1002691

[51] Int. Cl.$^7$ ............... B29C 45/02; B29C 45/66
[52] U.S. Cl. ............... 264/272.17; 425/116; 425/451.5; 425/592
[58] Field of Search ............... 425/116, 117, 425/129.1, 544, 451.5, 451.6, 592, 593, DIG. 228; 264/272.17

[56] References Cited

U.S. PATENT DOCUMENTS

| | | | |
|---|---|---|---|
| 3,418,692 | 12/1968 | Valyi | 425/593 |
| 4,589,830 | 5/1986 | Clawson | 425/150 |
| 4,915,608 | 4/1990 | Tsutsumi et al. | 425/121 |
| 5,330,347 | 7/1994 | Ten Vaarwerk | 425/451.6 |
| 5,350,291 | 9/1994 | Kitajima | 425/593 |

FOREIGN PATENT DOCUMENTS

| | | |
|---|---|---|
| 366810 | 5/1990 | European Pat. Off. . |
| 0 428 792 | 5/1991 | European Pat. Off. . |
| 594863 | 5/1994 | European Pat. Off. . |
| 0 633 111 | 1/1995 | European Pat. Off. . |
| 976 667 | 2/1964 | Germany . |
| 1704064 | 4/1971 | Germany . |
| 42 00 224 | 7/1993 | Germany . |
| 93 12 232.2 | 12/1993 | Germany . |
| 61-246023 | 11/1986 | Japan . |
| 62-069521 | 3/1987 | Japan . |
| 62-248615 | 10/1987 | Japan . |
| 3-180307 | 8/1991 | Japan . |
| 5-206186 | 8/1993 | Japan . |
| 5-261753 | 10/1993 | Japan . |
| 7-178594 | 7/1995 | Japan . |
| 452 127 | 11/1987 | Sweden . |
| 724 103 | 2/1955 | United Kingdom . |
| 1 186 148 | 4/1970 | United Kingdom . |

*Primary Examiner*—Robert Davis
*Attorney, Agent, or Firm*—Young & Thompson

[57] ABSTRACT

A device for encapsulating electronic components mounted on lead frames in a mold assembled from two mold halves movable relative to each other and closable onto each other. The device for causing the mold halves to move and to close are formed by a rotatable eccentric which can be coupled to one of the mold halves with interposing of at least one connecting rod. The invention also relates to a method for driving such a connecting rod. Another aspect of the invention relates to an encapsulating device wherein a one mold half is connectable to the device for causing the mold halves to move and close and the second mold half is connectable to a counter-plate which forms part of the device, which counter-plate is displaceable between two end positions. Yet another aspect of the invention relates to an encapsulating device with a counter-plate that includes a plurality of stacked, substantially plate-like parts, between which parts at least one shaft is placed. A further aspect of the invention is formed by a device for exerting pressure on encapsulating material including at least two screw spindles.

8 Claims, 5 Drawing Sheets

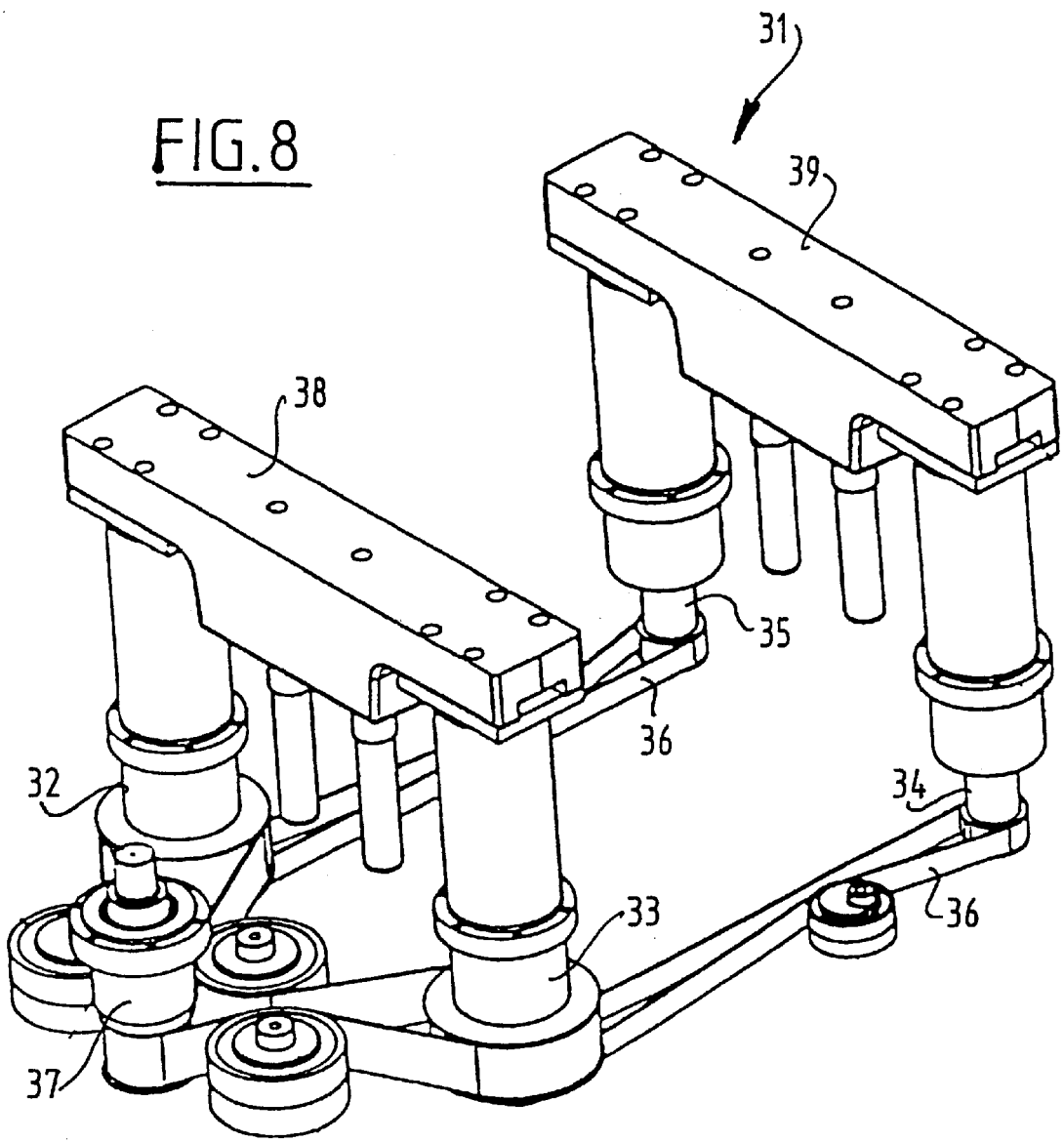

PRESS FOR ENCAPSULATING ELECTRONIC COMPONENTS AND METHODS FOR USE OF THE PRESS

BACKGROUND AND SUMMARY OF THE INVENTION

The invention relates to a device for encapsulating electronic components, mounted on so-called lead frames, in a mould assembled from two mould halves movable relative to each other and closable onto each other, comprising:

means for causing the mould halves to move and to close, and means for exerting pressure on encapsulating material which can be placed in cavities of the mould.

The invention also relates to methods for operating such a device.

Existing presses of the type mentioned in the preamble operate at limited speeds and are susceptible to malfunction and require frequent maintenance.

The present invention has for its object to provide an improved device and improved methods for operating such a device with which electronic components can be encapsulated at higher speed and with less chance of breakdown.

The invention provides for this purpose a device of the type stated in the preamble wherein the means for causing the mould halves to move and to close are formed by a rotatable eccentric which can be coupled to one of the mould halves with interposing of at least one connecting rod. The dimensions of the eccentric are preferably such that the position of the eccentric in a fully opened position of the mould halves is rotated less than 180° relative to the position of the eccentric in which the mould halves close onto each other. A first advantage of a rotatable eccentric for causing the mould halves to move and close is that the movement can take place relatively rapidly. A rotation of the eccentric of a maximum of 180° can take place very rapidly, while an alternative such as for instance driving of a mould half with a screw spindle is less rapid. A second important advantage of the rotatable eccentric is the very favourable movement characteristic which can be derived therefrom. When reaching the two extreme positions of the mould half to be driven, the position of the eccentric will, at a turn of 180° of the eccentric as seen from the driven-out mould half, be situated almost completely behind respectively almost completely in front of the rotation axis of the eccentric. The speed of movement of the driven mould half will, at constant rotation speed of the eccentric, correspond with semi-sinusoids, wherein the speeds close to the end positions approach 0 metres per second. While this ideal situation is only achieved at a rotation of the eccentric through 180°, in practice this will have to be slightly less than 180°. A very significant portion of the semi-sinusoids will however be recognizable in the movement characteristic of the driven mould half. This movement characteristic increases the drive speed of the eccentric still further since in the critical positions, i.e. when approaching the end positions of the driven mould half, the speed of the driven mould half will be lower than the speed of the driven mould half when it is situated between the two end positions. Another advantage of this movement characteristic is that the load of the machine parts as well as the energy consumption will be limited compared to existing encapsulating devices. Yet another advantage is that an encapsulating device with a rotatable eccentric requires relatively little maintenance.

In a preferred embodiment the device is provided with a force sensor for measuring the force with which the mould halves close, which force sensor is connected to the drive of the eccentric in order to supply a signal to the drive of the eccentric when a desired closing force has been reached. Due to this step the eccentric not only functions to cause displacement of the driven mould half but the desired closing force can also be provided using the eccentric.

The connecting rod for coupling the rotatable eccentric to one of the mould halves is preferably curved respectively angular. This shape makes it possible to apply a continuous rotation shaft for the eccentric. The curved respectively angular connecting rod in fact enables rotation of the eccentric to a position in which it lies on the side of the rotation axis remote from the mould half. Since the eccentric does not run through a full circular movement a crankshaft construction with interrupted rotation shaft can be avoided. This increases the robustness of the device.

In a preferred embodiment of the invention the rotatable eccentric can be coupled to one of the mould halves with interposing of the rod mechanisms, which rod mechanisms for obtaining a lever comprise at least one drive member which is linearly movable by the connecting rod, which drive member is coupled with at least two pivotable arms to at least two knee levers, which knee levers engage on one side at fixed positions and engage on the opposite side on a fixing part for a mould half. By means of this construction a precise linear translation of the fixing part is obtained. By means of the knee levers large force amplification also occurs at the end of the stroke of the encapsulating device. Using a relatively simple drive sufficient closing force can nevertheless be obtained hereby to encapsulate electronic components.

The invention also comprises a method for driving a device such as described in the preamble, wherein by causing an eccentric to rotate a mould half coupled to the eccentric is moved. The advantages of moving a mould half with an eccentric have already been elucidated above.

The invention also comprises a device of the type stated in the preamble wherein a one mould half is connectable to the means for causing the mould halves to move and close and the second mould half is connectable to a counter-plate which forms part of the device, which counter-plate exerts a force directed to the one mould half and which counter-plate is displaceable between two end positions such that it can be carried along over a distance by the one driven mould half when the mould halves make mutual contact. Using this construction it is possible to move the mould halves against each other at relatively great speed without this directly resulting in a large closing force. When the counter-plate is situated between the two end positions, the closing force between the mould halves is determined by the force which the counter-plate exerts in the direction of the one mould half. In this manner a fixed closing force can be realized wherein it is possible to detect whether the mould halves close properly onto each other. The advantage hereof is that damage to mould parts can be prevented or at least limited by not increasing the closing force further when the mould halves do not close onto each other correctly. This may for instance be the case when a lead frame is not placed correctly in a mould half or when a pellet of encapsulating material is positioned incorrectly. Yet another advantage is that the safety of such an encapsulating device is improved. If a body part becomes caught between the mould halves it is possible to react to this when the closing force is still limited, i.e. when the counter-plate is still situated between the two end positions.

The encapsulating device with the movable counter-plate preferably comprises a guide along which the counter-plate is displaceable and the end positions are preferably determined by stops. These steps provide the counter-plate with the desired freedom of movement and also make it possible to increase the closing force in one end position to the closing force required during encapsulating.

In preference the counter-plate is substantially vertically displaceable and the force directed to the one mould half then preferably consists at least of the gravitational force on the counter-plate. The substantially vertically displaceable counter-plate provides a force directed toward the one mould half without additional steps, since the gravitational force on the counter-plate is after all already present. If this force is not sufficiently large, it is possible to adapt the weight of the counter-plate. Another possibility for correcting a force which is respectively too large or too small is to arrange springs between a frame of the encapsulating device and the counter-plate. These springs can be either draw or pressure springs depending on the position where they engage on the frame. An additional force may for instance be required when the lead frames must be oriented by closing of the mould halves.

The encapsulating device is preferably provided with sensors for determining at least one end position of the counter-plate. The encapsulating device is preferably also provided with sensors for determining the distance between the mould halves. By means of the sensors it is possible to automate the control and monitoring of the operation of the encapsulating device.

The invention additionally comprises a method for closing a mould assembled from two mould halves movable relative to each other and closable onto each other for encapsulating electronic components mounted on so-called lead frames, wherein during closing of the mould the following steps are successively performed of:

a) placing the mould halves into mutual contact by causing a one mould half to move toward a second mould half, b) carrying along of the second mould half by the first mould half over a determined distance, wherein a force directed to the first mould half is exerted on the second mould half, c) building up a closing force between the two mould halves after reaching a fixed position of the second mould half.

Herein the distance between the mould parts is preferably measured during step b and step c is only initiated when the mould parts are connected. The advantages as already described for the device with the movable counter-plate also emerge in execution of this method. It is therefore also possible with this method to produce at greater speed, with less risk of damage to mould parts, a greater safety and a better controlled quality of the encapsulated product.

Another aspect of the encapsulating device referred to in the preamble comprises a counter-plate to which at least one of the mould halves is connectable, which counter-plate comprises: a plurality of stacked, substantially plate-like parts, between which parts at least one shaft is placed. This counter-plate preferably comprises two plate-like parts between which at least two parallel shafts are placed. Herein recesses are preferably arranged in the plate-like parts for co-action with the shafts. A significant drawback of the existing integrally formed counter-plates can be prevented by a counter-plate manufactured from a number of plate-like parts between which at least one shaft is placed. An existing counter-plate does have a tendency to deform slightly when a large closing force is built up. When a large closing force is being built up the counter-plate must be supported This can be achieved for instance by one or more stops against which the counter-plate then rests. At the positions where the counter-plate is not supported it subsequently tends to buckle up slightly. While in the case of a relatively thick counter-plate this deformation will be small it can still have very disturbing consequences for the encapsulating process since the closing force is not distributed uniformly over the mould halves. In the case of a lateral supporting of a counter-plate it is for instance possible for the closing force in the middle of a mould half to be considerably smaller than at the edges of this mould half. This is disadvantageous in the control of the quality of the encapsulated products.

By now dividing at least one counter-plate into layers between which at least one shaft is placed the counter-plate will no longer, or practically no longer, deform. This leads to a better controllable encapsulating result, while the wear of the mould halves will also take place evenly.

A simpler construction of the counter-plate with which at least a part of the above described effect can be obtained can consist of dividing the counter-plate into two substantially plate-like parts, wherein at least one of the two plates is provided on the contact side to the other plate with protruding parts in the form of for instance protrusions or ridges. The operation of the above described shafts is then taken over by these protruding parts. Although in respect of the deformation of the whole counter-plate this construction probably has less good properties than the counter-plate in which shafts are arranged between two plate-like parts this construction is still preferred to one solid counter-plate. An advantage of this simplified construction is that the construction height of the counter-plate with two plate-like parts, of which at least one is provided with overhanging portions, can be limited relative to the construction height wherein shafts must be arranged between the plate-like parts.

The invention also comprises a device of the type stated in the preamble wherein the means for exerting pressure on the encapsulating material comprise at least two screw spindles, which screw spindles are driven by a central drive and which, by rotation of the screw spindles, support a displaceable mounting point for at least one plunger. The screw spindles are preferably driven by a central motor with interposing of belts. Two screw spindles at a time preferably also support a beam which is displaceable by rotation of the screw spindles and on which at least one plunger is mountable. Instead of using a transfer plate on which the plungers engage, generally with interposing of a plunger block, a plunger displacement using screw spindles according to this invention has the advantage that it takes up very limited space. Another advantage of the centrally driven screw spindles is that this results in an exactly similar placing of the plungers, which in turn results in an improved quality of the encapsulated products.

BRIEF DESCRIPTION OF THE DRAWINGS

The present invention will be further elucidated with reference to the non-limitative embodiments shown in the following figures. Herein:

FIG. 8 is a perspective view of means for exerting pressure on encapsulating material with four screw spindles.

DESCRIPTION OF THE PREFERRED EMBODIMENTS

Figure 1:
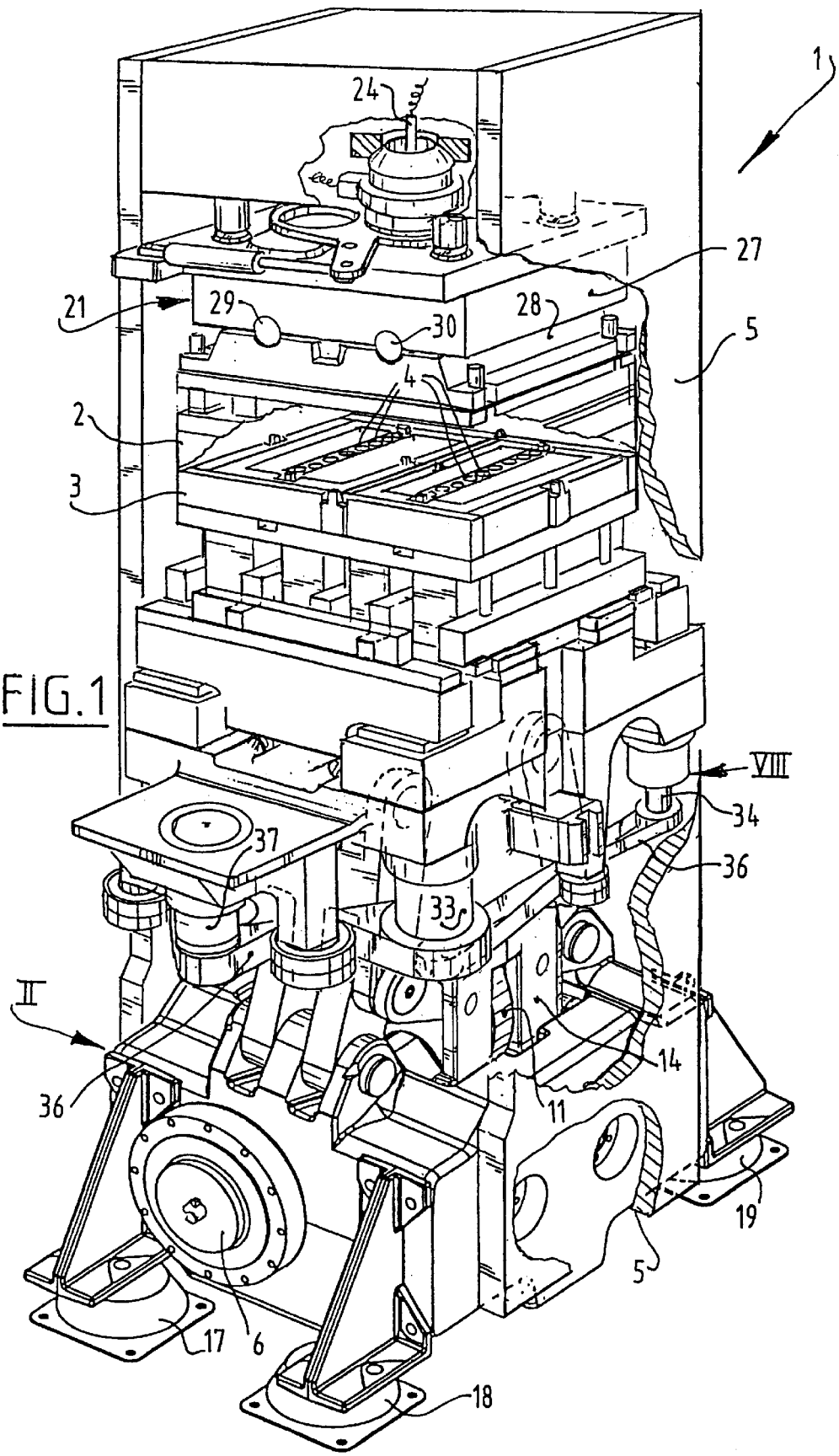
FIG. 1 shows a partly cut-away perspective view of an encapsulating device according to the invention.

FIG. 1 shows an encapsulating device 1 depicted in a pressing position. Fixed in encapsulating device 1 are two mould halves 2,3 in which the actual encapsulating process takes place. The upper mould half 2 is partly broken away to give a better view of the lower mould half 3. In lower mould half 3 recesses 4 are visible in which encapsulating material can be placed. By means of plungers not shown in this figure the encapsulating material placed in recesses 4 can then be placed under pressure such that it is urged toward mould cavities likewise not shown in this figure. The lower mould half 3 is vertically displaceable in a frame 5 of encapsulating device 1 for opening and closing mould halves 2,3. This opening is necessary for placing of the electronic components for encapsulating, arranging encapsulating material and removing the encapsulated products after the encapsulating operation. Accommodated in the frame 5 of encapsulating device 1 is a geared motor 6 for causing lower mould half 3 to move vertically. The vertical displacement of lower mould half 3 will be further elucidated with reference to FIGS. 2–4.

Figure 2:
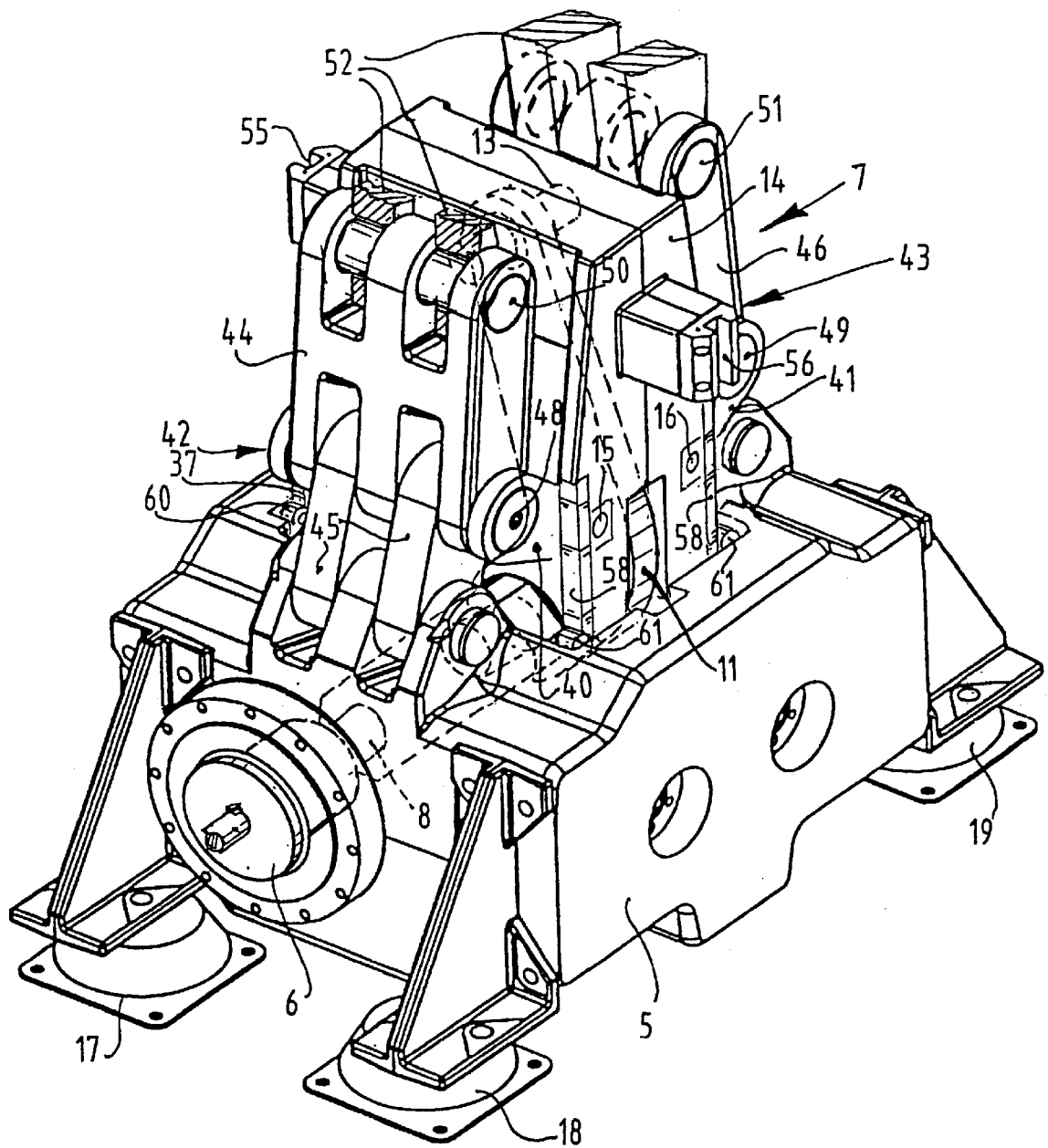
FIG. 2 is a perspective view of the drive means for causing the mould halves forming part of the encapsulating device of FIG. 1 to move and close.
Figure 4:
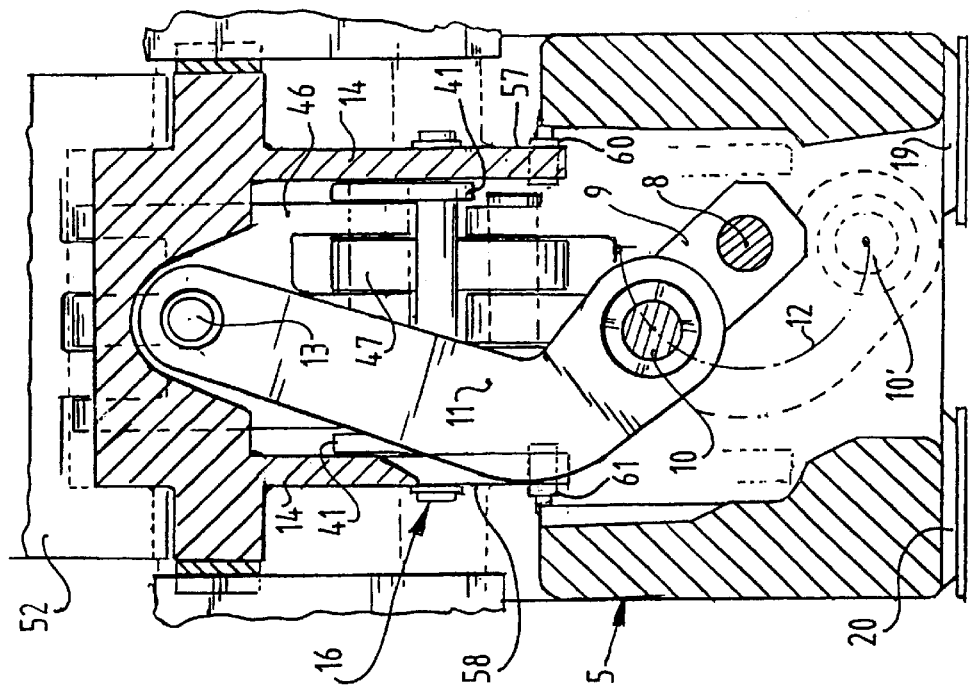
FIG. 4 shows a cross section through the drive means of FIG. 2 perpendicular to the cross section of FIG. 3.
Figure 3:
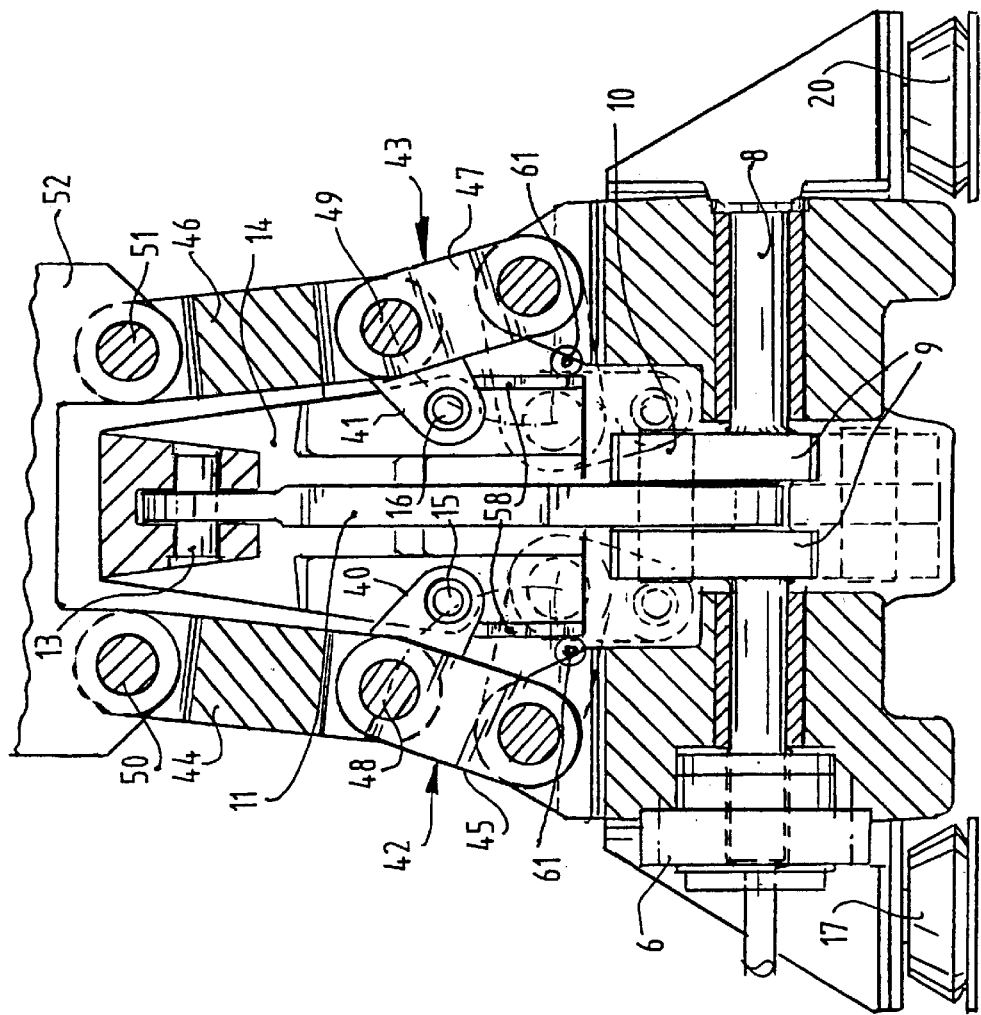
FIG. 3 shows a cross section through the drive means of FIG. 2.

The drive means 7 shown in FIG. 2 form part of encapsulating device 1. A geared motor 6 drives a horizontal shaft 8 on which is fixed an eccentric 9. This eccentric is shown more clearly in the cross section shown in FIGS. 3 and 4. The eccentric as shown in these figures is arranged on horizontal shaft 8 such that it does not have to be interrupted. This increases the robustness of drive means 7. Eccentric 9 comprises an eccentric shaft 10 to which a connecting rod 11 is rotatably connected. This connecting rod 11 has an angular construction as shown clearly in FIGS. 2 and 4. By rotating horizontal shaft 8 the position of eccentric shaft 10 will move along a circle segment-shaped path 12. Horizontal shaft 8 herein rotates through a maximum of 180°; this makes it possible to give horizontal shaft 8 a continuous construction. The curved shape of connecting rod 11 is required to enable placing of eccentric shaft 10 in a position as shown in FIG. 4 by means of the eccentric shaft 10' designated with the broken line.

The connecting rod 11 engages pivotally on its side remote from eccentric shaft 10 onto a shaft 13 which is connected to a so-called cross-head 14. This cross-head 14 is arranged for vertical guiding in frame 5. For this purpose the cross-head 14 is provided with guide blocks 55,56 which engage on vertical profile edges mounted on frame S. For an increased stability of cross-head 14 the sides of cross-head 14 are provided with hardened steel strips 57,58. Onto these hardened steel strips 57,58 engage guide elements 60,61 which can for instance be provided with a roller as shown in this figure. The great advantage of the chosen guiding construction is that the guiding stability thereby obtained is greatest in closed position of mould parts 2,3 and this is also the position in which the force exerted on mould parts 2,3 is greatest. The cross-head 14 is pivotally coupled to respective arms 40,41 by means of the parallel shafts 15,16. These arms 40,41 arranged mirror symmetrically relative to the centre of cross-head 14 engage pivotally on their side remote from cross-head 14 onto respective knee lever mechanisms 42,43. The knee lever mechanisms 42,43 are pivotally connected on the underside to frame 5 and are is also pivotally connected to respective arms 40, 41 at the location where the respective rods 44,45 and 46,47 are mutually connected by knee lever shafts. The tops of knee lever mechanisms 42,43 are coupled by means of the parallel shafts 50,51 to a fixing part 52 which is guidable vertically in the frame. By causing eccentric 9 to move, the connecting rod 11 will ensure a vertical movement of cross-head 14. The vertical movement of cross-head 14 results in knee lever mechanisms 42,43 being driven by means of arms 40,41. Such a construction results in a large force amplification particularly at the end of the stroke of encapsulating device 1 and also ensures a uniform vertical translation of fixing part 52; loss of alignment of fixing part 52 will not occur. Frame 5 supports on a ground by means of legs 17–20.

Figure 5:
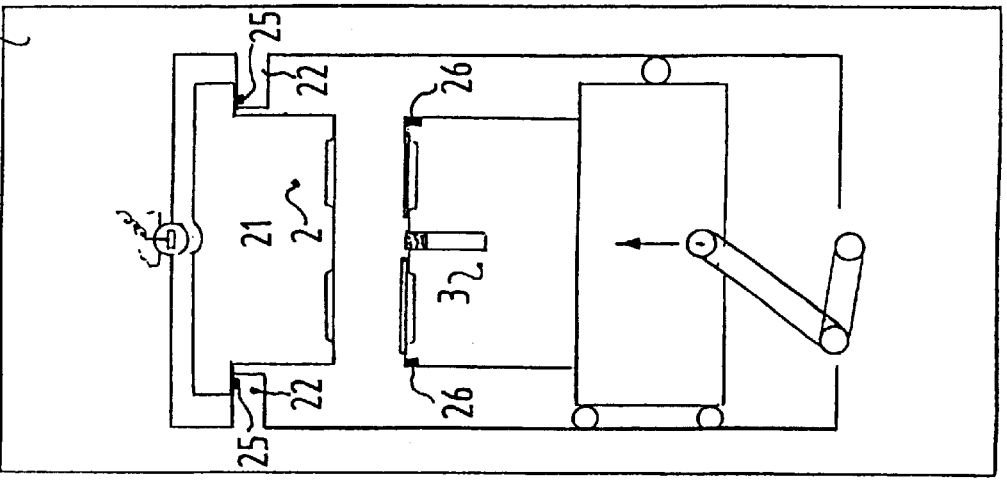
FIG. 5 shows a schematic cross section through an encapsulating device with movable counter-plate with opened mould halves.

The upper mould half 2 is coupled to a vertically movable counter-plate 21. This is shown schematically in FIGS. 5–7. In the opened position of mould halves 2,3 as shown in FIG. 5, the counter-plate 21 lies against the lower stops 22. By subsequently moving lower mould half 3 upward after it connects to the upper mould half 2 the counter-plate 21 is lifted from the lower stops 22. The gravitational force will herein exert a force F on the counter-plate, by which force F (increased with the gravitational force on upper mould half 2) mould halves 2,3 are urged against each other. By means of this construction the closing force of mould halves 2,3 can be precisely controlled in the position as shown in FIG. 6.

Figure 7:
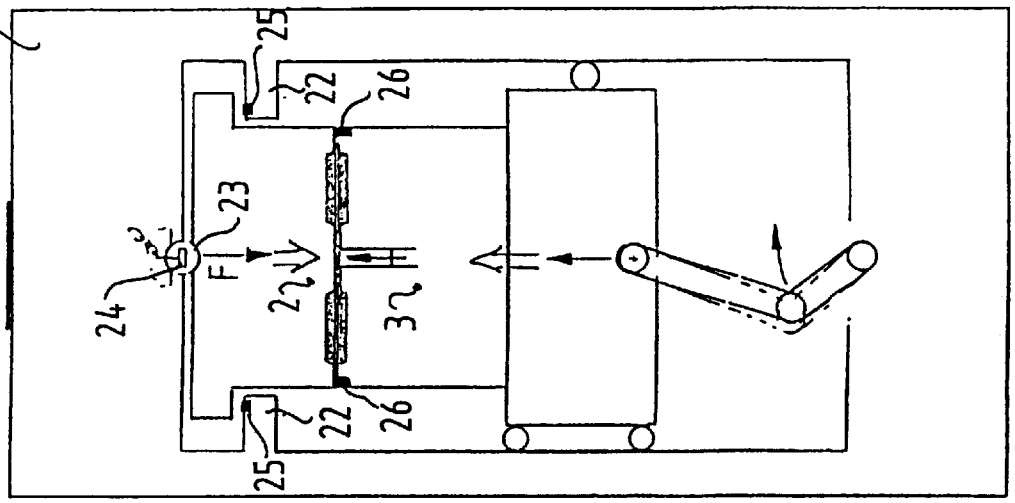
FIG. 7 shows a schematic cross section of FIG. 5 and 6 with closed mould halves in an end position.
Figure 6:
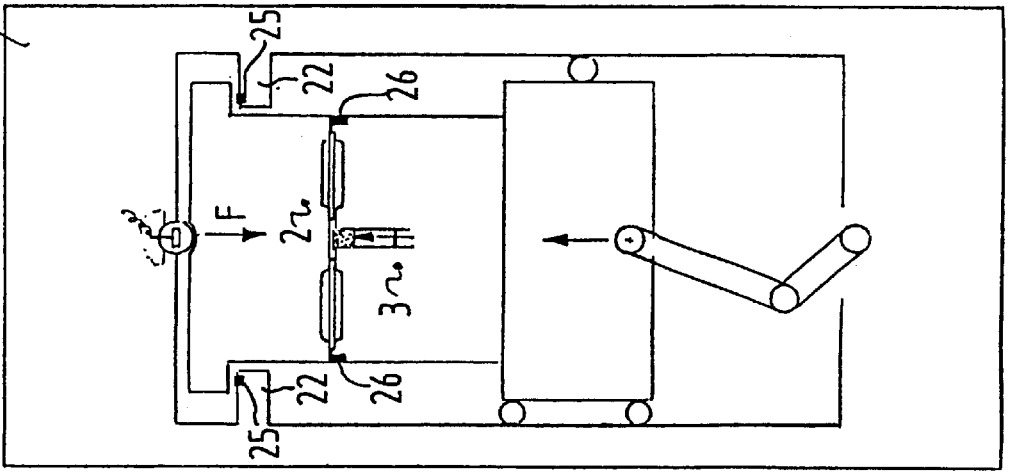
FIG. 6 shows the schematic cross section of FIG. 5 with closing mould halves in an intermediate position.

Subsequently shown in FIG. 7 is the position in which the lower mould half 2 is displaced further upward relative to the situation as shown in FIG. 6. Counter-plate 21 herein comes to lie against upper stop 23 whereby an increased closing force can be built up. The upper stop 23 is formed in this figure by a hinge construction which forms a parallelism maintaining device for eliminating or offsetting a possibly inclined position of counter-plate 21. Also incorporated in upper stop 23 is a pressure-sensitive sensor 24 for measuring the closing force of mould halves 2,3. Also shown in FIGS. 5–7 are contact sensors 25 in the lower stops 22 with which can be detected that counter-plate 21 is raised from the lower stops 22. Also included in lower mould half 3 are distance sensors 26 for determining the distance between mould halves 2,3. By means of contact sensors 25 it is possible to determine when counter-plate 21 is situated in a position as shown in FIG. 6. In this position the closing force F of mould halves 2,3 is also known. For checking purposes it is now possible to measure the distance between mould halves 2,3. When it is ascertained that mould halves 2,3 do not fully close unto each other the lower mould half 3 can be moved back to the starting position as shown in FIG. 5. It is in that case very probable that an electronic component or encapsulating material has not been correctly placed in lower mould half 3. By means of the device and method as described in this invention it is possible to detect such an incorrect placing of an object before the closing force is built up with the encapsulating device when it is in the situation as shown in FIG. 7.

FIG. 1 also shows that counter-plate 21 is formed by two plate-like parts 27,28 between which two horizontal shafts 29,30 are placed. A thus constructed counter-plate 21 will deform relatively little despite a plate-like part 27 which supports only at determined points on the top. That is, the underside of plate-like part 28 remains virtually flat. This results in a very good connection of mould halves 2,3 during the build-up of a large closing force as required during encapsulation of electronic components.

Finally, FIG. 8 shows the means 31 for exerting pressure on encapsulating material placed in recesses 4. These means are also recognizable in the encapsulating device 1 as shown in FIG. 1. The means 31 for exerting pressure comprise four vertical screw spindles 32–35 which are driven by a central motor 37 by means of belts 36. By means of rotating screw spindles 32–35 horizontal beams 38,39 are horizontally displaceable in synchronous manner. Plungers (not shown here) can subsequently engage on these horizontal beams 38,39, optionally with inter-posing of other elements such as plunger blocks, which plungers fall into the recesses 4 on the underside of lower mould half 3. By rotating screw spindles 32–35 the encapsulating material placed in recesses 4 can thus be placed under pressure. The means 31 for exerting pressure on the encapsulating material are constructed such that they take up relatively little space in encapsulating device 1.

What is claimed is:

1. Device for encapsulating electronic components, mounted on lead frames, in a mould assembled from two mould halves movable relative to each other and closable onto each other, comprising:

means for causing the mould halves to move and to close, and means for exerting pressure on encapsulating material which can be placed in cavities of the mould, wherein the means for causing the mould halves to move and to close comprises a rotatable eccentric coupled to one of the mould halves with interposing of at least one connecting rod, wherein (a) an axis of rotation of said rotatable eccentric, (b) an axis of a coupling of said connecting rod to said rotatable eccentric, and (c) an axis of a coupling of said connecting rod to said one of the mould halves, are not coplanar when the mould halves are closed onto one another.

2. Encapsulating device as claimed in claim 1, wherein the dimensions of the eccentric are such that the position of the eccentric in a fully opened position of the mould halves is rotated less than 180° relative to the position of the eccentric in which the mould halves close onto each other.

3. Encapsulating device as claimed in claim 1, wherein the device is provided with a force sensor for measuring the force with which the mould halves close, which force sensor is connected to the drive of the eccentric in order to supply a signal to the drive of the eccentric when a desired closing force has been reached.

4. Encapsulating device as claimed in claim 1 wherein the connecting rod is curved respectively angular.

5. Encapsulating device as claimed in claim 1, wherein the rotatable eccentric can be coupled to one of the mould halves with interposing of a rod mechanism, which rod mechanism for obtaining a lever comprises at least one drive member which is linearly movable by the connecting rod, which drive member is coupled with at least two pivotable arms to at least two knee levers, which knee levers engage pivotally on one side at fixed positions and engage on the opposite side on a fixing part for a mould half.

6. Method for driving a device for encapsulating electronic components, mounted on lead frames, in a mould assembled from two mould halves movable relative to each other and closable onto each other, comprising:

causing the mould halves to move and to close, and exerting pressure on encapsulating material which can be placed in cavities of the mould by causing a rotatable eccentric to rotate to move one of the mould halves coupled to the eccentric through a connecting rod, wherein (a) an axis of rotation of said rotatable eccentric, (b) an axis of a coupling of said connecting rod to said rotatable eccentric, and (c) an axis of a coupling of said connecting rod to said one of the mould halves, are not coplanar when the mould halves are closed onto one another.

7. A device for encapsulating electronic components using a mold with two mold halves, the device comprising:

a drive member that moves linearly to urge one of the two mold halves toward the other of the two mold halves;

a rotatable eccentric connected to said drive member to move said drive member; and at least two knee levers, each with a bending axis that is coupled to said drive member through a pivotable arm, each of said knee levers having one end that is movable and connected to said one mold half and an opposite end that is fixed.

8. A device for encapsulating electronic components mounted on a lead frame in a mold having two mold halves that are movable relative to each other and closable onto each other, the device comprising:

first means for causing the mold halves to move and to close; and second means for exerting pressure on encapsulated material in cavities in the mold;

said first means comprising a rotatable eccentric that is coupled to one of the mold halves through at least one connecting rod and a rod mechanism, said rod mechanism comprising, at least one drive member that is moved linearly by said connecting rod, and at least two knee levers that are coupled to said drive member through respective pivotable arms, each of said knee levers being pivotally engaged at one end at a fixed position and at an opposite end at the one of the mold halves.

* * * * *